United States Patent
Tsukahara et al.

(10) Patent No.: US 8,304,338 B2
(45) Date of Patent: Nov. 6, 2012

(54) METHOD OF JOINING ELECTRONIC COMPONENT AND THE ELECTRONIC COMPONENT

(75) Inventors: Norihito Tsukahara, Kyoto (JP);
Masayoshi Koyama, Osaka (JP)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 12/728,555

(22) Filed: Mar. 22, 2010

(65) Prior Publication Data
US 2010/0244283 A1 Sep. 30, 2010

(30) Foreign Application Priority Data
Mar. 24, 2009 (JP) ................................. 2009-071065

(51) Int. Cl.
*H01L 21/44* (2006.01)
(52) U.S. Cl. ........ 438/613; 257/613; 257/737; 257/782; 257/E21.508; 257/E23.069
(58) Field of Classification Search .................. 438/613; 257/737, 782, E21.508, E23.069
See application file for complete search history.

(56) References Cited

U.S. PATENT DOCUMENTS

| | | | | |
|---|---|---|---|---|
| 5,400,950 | A * | 3/1995 | Myers et al. | 228/180.22 |
| 7,214,622 | B2 | 5/2007 | Sugiyama et al. | |
| 2004/0166660 | A1* | 8/2004 | Yamaguchi | 438/613 |
| 2005/0285280 | A1* | 12/2005 | Yau | 257/786 |
| 2006/0030075 | A1 | 2/2006 | Sugiyama et al. | |
| 2007/0069378 | A1* | 3/2007 | Park et al. | 257/737 |
| 2008/0093740 | A1* | 4/2008 | Sakai et al. | 257/737 |
| 2008/0224309 | A1 | 9/2008 | Hori | |
| 2009/0008800 | A1* | 1/2009 | Nakatani et al. | 257/778 |
| 2009/0085227 | A1 | 4/2009 | Shiraishi et al. | |
| 2009/0140422 | A1* | 6/2009 | Park | 257/737 |
| 2011/0006433 | A1* | 1/2011 | Kanetaka | 257/773 |

FOREIGN PATENT DOCUMENTS

| | | |
|---|---|---|
| JP | 2004-158733 | 6/2004 |
| JP | 2006-49477 | 2/2006 |
| JP | 2006-245189 | 9/2006 |
| JP | 3955302 | 8/2007 |
| JP | 2008-78238 | 4/2008 |
| WO | 2006/123554 | 11/2006 |

* cited by examiner

*Primary Examiner* — Jarrett Stark
*Assistant Examiner* — John M Parker
(74) *Attorney, Agent, or Firm* — Hamre, Schumann, Mueller & Larson, P.C.

(57) ABSTRACT

Dummy electrodes (15) are disposed on wiring connected to first electrodes (2) of the substrate (1), outside a junction region containing all of the first electrodes (2) and second electrodes (6) and in bonding resin (4), the dummy electrodes (15) not being involved in electrical connection between the substrate (1) and the component (5). When conductive particles (3) in the bonding resin (4) are melted by heating, molten solder self-assembles and solidifies between the first electrodes (2) and the second electrodes (6) and on the dummy electrodes (15). With this configuration, the solder self-assembles between the adjacent dummy electrodes (15) and causes a solder short circuit. Thus it is possible to eliminate excessive solder supply between the adjacent first electrodes (2) and the adjacent second electrodes (6), thereby preventing short circuits between the adjacent first electrodes (2) and the adjacent second electrodes (6).

1 Claim, 16 Drawing Sheets

METHOD OF JOINING ELECTRONIC COMPONENT AND THE ELECTRONIC COMPONENT

FIELD OF THE INVENTION

The present invention relates to a method of joining an electronic component by which the component is mounted on a substrate by using the self-assembly of conductive particles such as solder powder contained in bonding resin.

BACKGROUND OF THE INVENTION

A known technique for joining a circuit board and an electronic component is "solder self-assembly" using "particle agglomeration to junction electrodes by a liquid surface tension".

Referring to FIGS. 17A to 17E, the solder self-assembly as disclosed in Japanese Patent No. 3955302 and so on will be described below.

In order to join a component 5 to electrodes 2 formed on a circuit board 1 as shown in FIG. 17E, bonding resin 4 containing solder powder 3 is supplied onto the electrodes 2 formed on the circuit board 1 as shown in FIG. 17A. As shown in FIGS. 18A and 18B, the electrodes 2 are formed in an area layout so as to be opposed to electrodes 6 of the component 5 to be joined.

The bonding resin 4 is supplied by typical supply methods of viscous materials. The supply methods include dispensing, screen printing, and transfer. As shown in FIGS. 19A and 19B, the bonding resin 4 is supplied over the electrodes 2 on the circuit board 1.

In FIG. 17B, the component 5 is held by a suction tool 7 above the circuit board 1 placed on a stage 9. The electrodes 6 are positioned in opposition to the electrodes 2, and the component 5 is held with a gap H between the electrodes 2 and the electrodes 6. In this state, at least one of a heater 8 provided in the suction tool 7 and a heater 10 provided in the stage 9 is operated to heat at least one of the component 5 and the circuit board 1 with a predetermined temperature profile, so that the solder powder 3 in the bonding resin 4 melts as shown in FIG. 17C. Further, in the gap H between the electrodes 2 and the electrodes 6 and around the gap H, convection Z is formed by molten solder 12, which is the agglomeration of the molten solder powder 3, and the resin components of the bonding resin 4, so that the molten solder 12 self-assembles between the electrodes 2 and the electrodes 6 due to particle agglomeration to the electrodes by a liquid surface tension.

After that, the circuit board 1 and the component 5 are cooled to the melting point of the solder powder 3 or lower, so that as shown in FIG. 17D, the molten solder 12 self-assembled between the electrodes 2 and the electrodes 6 solidifies and solder metal joints 13 are made between the electrodes 2 and the electrodes 6.

Reference numeral 11 denotes the resin components of the cured bonding resin 4. The resin components act as an underfill for protecting the junctions between the component 5 and the circuit board 1 and obtaining a bonding strength after the solder joints are made.

DISCLOSURE OF THE INVENTION

However, when specific electrodes, for example, electrodes in an area layout are joined, molten solder may excessively assemble on the outermost electrodes and cause a solder short circuit, resulting in unstable fabrication of a product.

To be specific, FIG. 21A is a cross sectional view showing the electrodes in an area layout. FIG. 21B is a plan view of the joints of the electrodes. As shown in FIGS. 21A and 21B, solder short circuits 14 are caused by excessively self-assembling solder on the outermost electrodes in the area layout after joining.

FIG. 20A shows that the bonding resin 4 is supplied over the electrodes 2 formed in the area layout on the circuit board 1. The solder powder 3 is evenly dispersed in the supplied bonding resin 4.

Next, as shown in FIG. 20B, the component 5 is held and heated to melt the solder powder 3 while keeping the gap between the electrodes 2 and the electrodes 6. Further, the convection Z is formed by the molten solder 12 and the resin components of the bonding resin 4, so that the solder powder 3 flows as shown in FIG. 20C.

Of the electrodes 2 formed in the area layout on the circuit board 1, in the case of an inner electrode, for example, an electrode b in FIG. 20C, the solder powder 3 in an area B is likely to self-assemble in a joining process. The area B is obtained by uniformly dividing distances from the adjacent electrodes with the electrode b placed at the center of the area B.

As a result, of the electrodes formed in the area layout, the inner electrodes b other than the outermost electrodes each have the uniform area B obtained by uniformly dividing distances from the adjacent electrodes with the electrode b placed at the center of the area B. Thus substantially equal amounts (equal volumes) of the solder powder 3 are likely to assemble on the electrodes b.

In the case of an outermost electrode a, the self-assembling solder powder 3 is present in a large area A containing the bonding resin 4 having been supplied outside the outermost electrodes.

This is because in a path Z where solder particles melt and flow, the outermost electrode a does not have any other electrodes on which molten solder wets and stays. Consequently, the outermost electrode a inevitably has a larger amount (volume) of self-assembling solder than the inner electrode b in the area layout.

In generally used material supply methods including dispensing and printing for viscous materials, it is quite difficult to equalize an amount of the solder powder 3 in the area A with an amount of the solder powder 3 in the area B, that is, to control the amount of the bonding resin 4 outside the electrodes of the area layout.

An object of the present invention is to provide a method of joining an electronic component by which a substrate and the component can be stably joined to each other by a solder self-assembly method without causing a short circuit.

A method of joining an electronic component according to the present invention, when bonding resin containing conductive particles is disposed between a substrate and the component, the bonding resin retained in a gap between the first electrodes of the substrate and the second electrodes of the component is heated and flows to cause the conductive particles melted between the first electrodes and the second electrodes to self-assemble, and then the substrate and the component are cooled to a temperature not higher than the solidification temperature of the conductive particles to mount the component on the substrate, the method including: arranging dummy electrodes on wiring connected to the first electrodes of the substrate, outside a junction region containing all of the first electrodes and the second electrodes and in the bonding resin, the dummy electrodes not being involved in electrical connection between the substrate and the component; and causing the conductive particles melted between the first electrodes and the second electrodes and on the dummy electrodes to self-assemble and solidify by a flow of the heated bonding resin.

A method of joining an electronic component according to the present invention, when bonding resin containing conductive particles is disposed between a substrate and the component, the bonding resin retained in a gap between the first electrodes of the substrate and the second electrodes of the component is heated and flows to cause the conductive particles melted between the first electrodes and the second electrodes to self-assemble, and then the substrate and the component are cooled to a temperature not higher than the solidification temperature of the conductive particles to mount the component on the substrate, the method including: arranging first dummy electrodes adjacent to the first electrodes and second dummy electrodes adjacent to the first dummy electrodes at shorter intervals than the first electrodes on the substrate, outside a junction region containing all of the first electrodes and the second electrodes and in the bonding resin, the first and second dummy electrodes being arranged as dummy electrodes not being involved in electrical connection between the substrate and the component; and causing the conductive particles melted between the first electrodes and the second electrodes and on the dummy electrodes to self-assemble and solidify by a flow of the heated bonding resin.

A method of joining an electronic component according to the present invention, when bonding resin containing conductive particles is disposed between a substrate and the component, the bonding resin retained in a gap between the first electrodes of the substrate and the second electrodes of the component is heated and flows to cause the conductive particles melted between the first electrodes and the second electrodes to self-assemble, and then the substrate and the component are cooled to a temperature not higher than the solidification temperature of the conductive particles to mount the component on the substrate, the method including: arranging dummy electrodes on wiring connected to the second electrodes of the component, outside a junction region containing all of the first electrodes and the second electrodes and in the bonding resin, the dummy electrodes not being involved in electrical connection between the substrate and the component; and causing the conductive particles melted between the first electrodes and the second electrodes and on the dummy electrodes to self-assemble and solidify by a flow of the heated bonding resin.

A method of joining an electronic component according to the present invention, when bonding resin containing conductive particles is disposed between a substrate and the component, the bonding resin retained in a gap between the first electrodes of the substrate and the second electrodes of the component is heated and flows to cause the conductive particles melted between the first electrodes and the second electrodes to self-assemble, and then the substrate and the component are cooled to a temperature not higher than the solidification temperature of the conductive particles to mount the component on the substrate, the method including: arranging first dummy electrodes adjacent to the second electrodes and second dummy electrodes adjacent to the first dummy electrodes at shorter intervals than the second electrodes on the component, outside a junction region containing all of the first electrodes and the second electrodes and in the bonding resin, the first and second dummy electrodes being arranged as dummy electrodes not being involved in electrical connection between the substrate and the component; and causing the conductive particles melted between the first and second electrodes and on the dummy electrodes to self-assemble and solidify by a flow of the heated bonding resin.

An electronic component of the present invention is obtained such that bonding resin containing conductive particles is disposed between a substrate and the component, the bonding resin retained in a gap between the first electrodes of the substrate and the second electrodes of the component is heated and flows to cause the conductive particles melted between the first electrodes and the second electrodes to self-assemble, and then the substrate and the component are cooled to a temperature not higher than the solidification temperature of the conductive particles to mount the component on the substrate, wherein dummy electrodes are formed on wiring connected to the first electrodes of the substrate, outside a junction region containing all of the first electrodes and the second electrodes and in the bonding resin, the dummy electrodes not being involved in electrical connection between the substrate and the component.

An electronic component of the present invention is obtained such that bonding resin containing conductive particles is disposed between a substrate and the component, the bonding resin retained in a gap between the first electrodes of the substrate and the second electrodes of the component is heated and flows to cause the conductive particles melted between the first electrodes and the second electrodes to self-assemble, and then the substrate and the component are cooled to a temperature not higher than the solidification temperature of the conductive particles to mount the component on the substrate, wherein first dummy electrodes adjacent to the first electrodes and second dummy electrodes adjacent to the first dummy electrodes at shorter intervals than the first electrodes are formed on wiring connected to the first electrodes of the substrate, outside a junction region containing all of the first electrodes and the second electrodes and in the bonding resin, the first and second dummy electrodes being formed as dummy electrodes not being involved in electrical connection between the substrate and the component.

An electronic component of the present invention is obtained such that bonding resin containing conductive particles is disposed between a substrate and the component, the bonding resin retained in a gap between the first electrodes of the substrate and the second electrodes of the component is heated and flows to cause the conductive particles melted between the first electrodes and the second electrodes to self-assemble, and then the substrate and the component are cooled to a temperature not higher than the solidification temperature of the conductive particles to mount the component on the substrate, wherein dummy electrodes are formed on wiring connected to the second electrodes of the component, outside a junction region containing all of the first electrodes and the second electrodes and in the bonding resin, the dummy electrodes not being involved in electrical connection between the substrate and the component.

An electronic component of the present invention is obtained such that bonding resin containing conductive particles is disposed between a substrate and the component, the bonding resin retained in a gap between the first electrodes of the substrate and the second electrodes of the component is heated and flows to cause the conductive particles melted between the first electrodes and the second electrodes to self-assemble, and then the substrate and the component are cooled to a temperature not higher than the solidification temperature of the conductive particles to mount the component on the substrate, wherein first dummy electrodes adjacent to the second electrodes and second dummy electrodes adjacent to the first dummy electrodes at shorter intervals than the second electrodes are formed on the component, outside a junction region containing all of the first electrodes and the second electrodes and in the bonding resin, the first and second dummy electrodes being formed as dummy electrodes not being involved in electrical connection between the substrate and the component.

According to this configuration, the dummy electrodes are formed at proper locations on the substrate or the component. Thus by causing excessive molten conductive metal to self-assemble on the dummy electrodes, it is possible to eliminate a short circuit on the electrodes of the substrate and the electrodes of the component, thereby achieving mass production with stable quality.

DESCRIPTION OF THE EMBODIMENTS

Referring to FIGS. 1A and 1B to 16, embodiments of the present invention will be described below.
(First Embodiment)

FIGS. 1A and 1B to 7A and 7B show a first embodiment of the present invention.

Figure 1A:
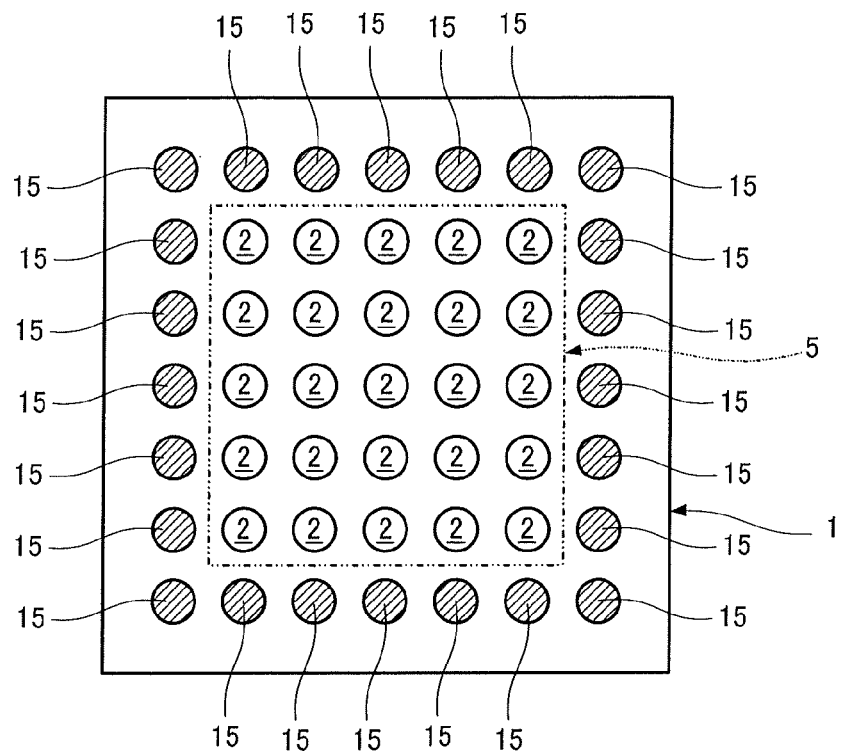
FIG. 1A is an enlarged plan view showing a circuit board used in a first embodiment of the present invention.

As shown in FIG. 1A, on a circuit board 1, 25 electrodes 2 are uniformly spaced in an area layout so as to be opposed to electrodes 6 of a component 5, and 24 dummy electrodes 15 not involved in electrical connection to the electrodes 6 of the component 5 are formed around the electrodes 2. As is evident from the size of the component 5 indicated by a virtual line in FIG. 1A, the component 5 has no electrodes corresponding to the dummy electrodes 15 provided on the side of the circuit board 1. The dummy electrodes 15 are hatched in distinction from the electrodes 2 of the circuit board 1 electrically connected to the electrodes 6 of the component 5.

Figure 1B:
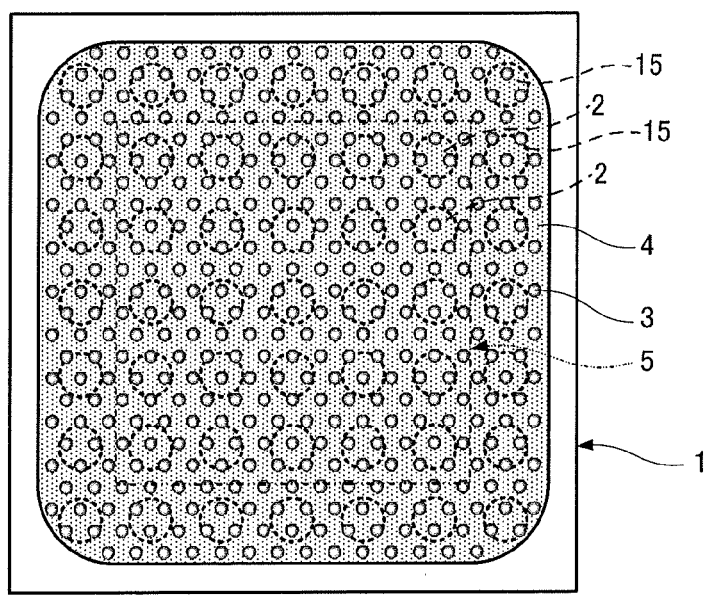
FIG. 1B is a plan view showing a state in which bonding resin is supplied to the circuit board used in the first embodiment.

As shown in FIG. 1B, bonding resin 4 is supplied over the dummy electrodes 15.

FIG. 1B schematically shows an example in which the bonding resin 4 is supplied over all the formed dummy electrodes 15. It is not always necessary to supply the bonding resin 4 over all the electrodes. The bonding resin 4 may flow to cover the dummy electrodes 15 in the subsequent joining process.

The circuit board 1 having the electrodes 2 and the dummy electrodes 15 and the component 5 having the electrodes 6 are aligned with each other such that the electrodes 2 and the electrodes 6 face each other. In a state in which a gap H is kept between the electrodes 2 and the electrodes 6, at least one of a heater 8 provided in a suction tool 7 and a heater 10 provided in a stage 9 is operated to heat at least one of the component 5 and the circuit board 1 with a predetermined temperature profile.

Figure 2:
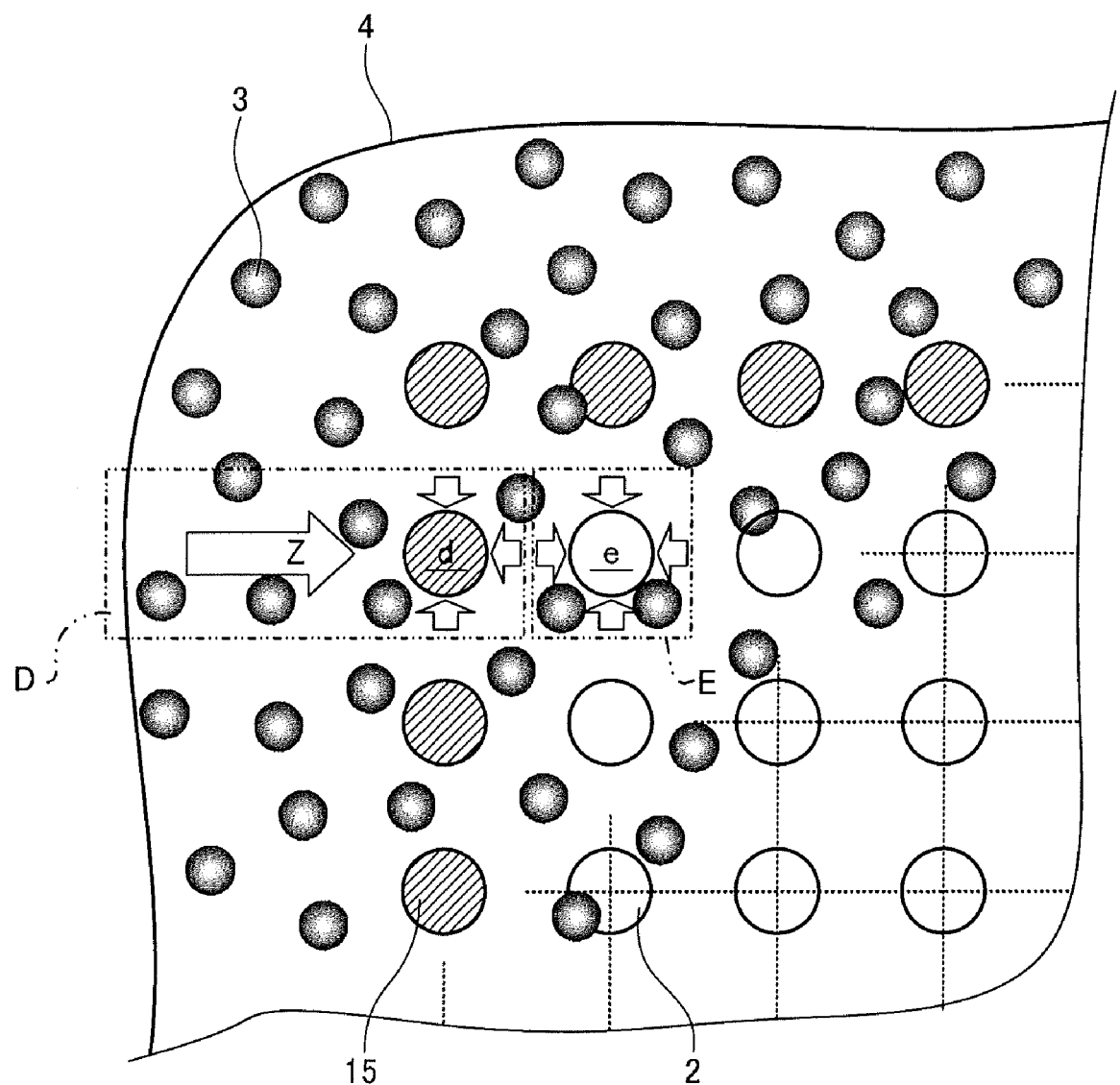
FIG. 2 is an explanatory drawing showing the effect of dummy electrodes according to the first embodiment.

FIG. 2 shows a flowing behavior of solder powder 3 acting as conductive particles in the bonding resin 4 at this point.

Of the electrodes 2 formed in the area layout on the circuit board 1, in the case of an outermost electrode e, the solder powder 3 in an area E is likely to self-assemble in the joining process. The area E is obtained by uniformly dividing distances from the adjacent electrodes with the electrode e placed at the center of the area E.

The electrodes 2 other than the outermost electrode e each have the uniform area E obtained by uniformly dividing distances from the adjacent electrodes with the electrode 2 placed at the center of the area E. Thus substantially equal amounts (equal volumes) of the solder powder 3 are likely to self-assemble on the electrodes 2.

In the case of the dummy electrodes 15 formed outside the electrodes 2, for example, an electrode d in FIG. 2, the self-assembling solder powder 3 is present in a large area D containing the bonding resin 4 having been supplied outside the dummy electrodes 15.

This is because in a path Z where solder particles melt and flow, the outermost dummy electrode 15 does not have any other electrodes on which molten solder wets and stays. Consequently, the outermost electrode d inevitably has a larger amount (volume) of self-assembling solder than the inner electrode e.

Figure 3A:
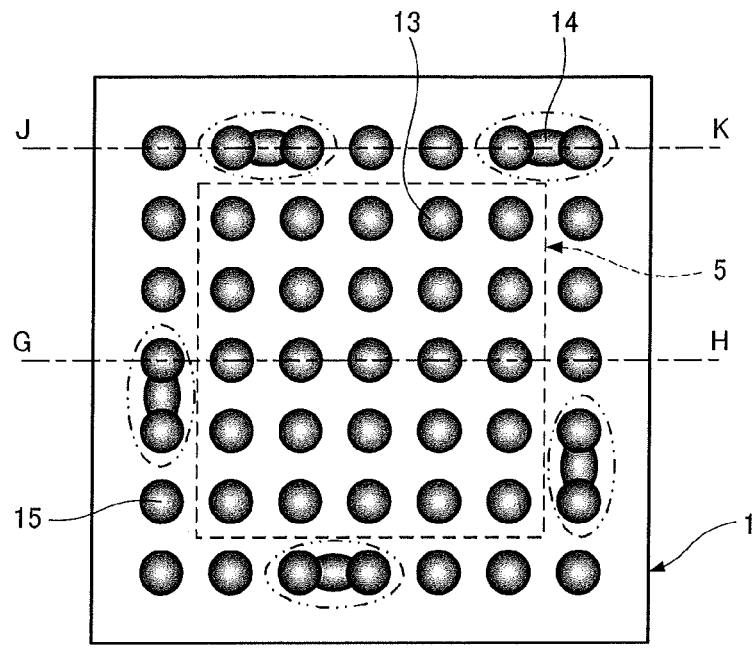
FIG. 3A is a horizontal sectional view showing excessive solder captured by the dummy electrodes according to the first embodiment.
Figure 3B:
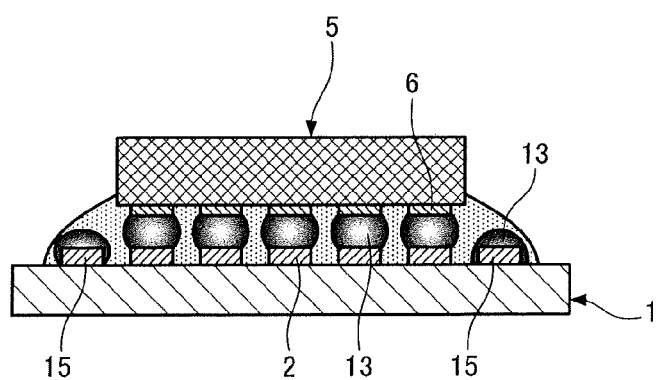
FIG. 3B is a G-H sectional view showing the excessive solder captured by the dummy electrodes according to the first embodiment.
Figure 3C:
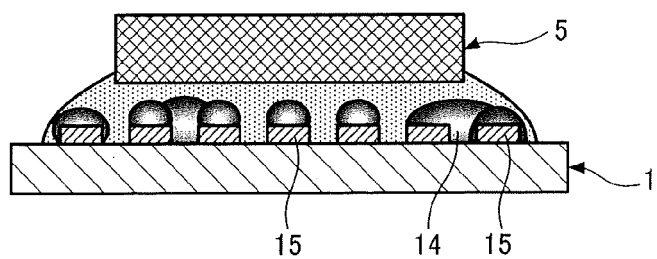
FIG. 3C is a J-K sectional view showing the excessive solder captured by the dummy electrodes according to the first embodiment.

Therefore, after the completion of joining in FIG. 3A, a larger amount of solder self-assembles on the dummy electrodes 15 than on the electrodes 2, so that as shown in FIGS. 3A and 3C, excessive solder is absorbed and thus solder short circuits 14 may occur at some points.

The dummy electrodes 15 absorb excessive solder thus, so that as shown in FIG. 3B, the electrodes 2 satisfactorily make solder metal joints 13 with the electrodes 6 with an equal amount of solder.

However, the dummy electrodes 15 on which excessive solder self-assembles are unnecessary electrodes in an electric circuit design. Thus even in the event of the solder short circuits 14, the electrical characteristics are not adversely affected.

FIG. 3A is a schematic drawing showing solder joints observed by X-rays from the above after joining. FIG. 3B is a sectional view taken along line G-H of FIG. 3A. FIG. 3C is a sectional view taken along line J-K of FIG. 3A.

Consequently, unlike in the prior art, the circuit board 1 and the component 5 can be stably joined to each other without causing solder short circuits on the outermost electrodes for joining in the area layout.

In FIGS. 1A and 1B to 3A, 3B, and 3C, the dummy electrodes 15 for absorbing excessive solder are formed on the circuit board 1. The present invention is not limited to this configuration. The dummy electrodes 15 may be formed on the side of the component 5.

FIGS. 1A and 1B to 3A, 3B, and 3C show the electrodes in the area layout. The present invention is not limited to this configuration. The electrodes may be peripherally arranged or other electrode layouts may be used.

Further, FIGS. 1A and 1B to 3A, 3B, and 3C show the dummy electrodes 15 not electrically connected to the electrodes 2 for joining. The present invention is not limited to this configuration. For example, the dummy electrodes 15 may be formed on a circuit pattern routed through the surface layer of the board from the electrodes 2 for joining in the area layout.

EXAMPLE 1

The circuit board 1 of FIG. 1A was a glass epoxy board of grade FR4 and also a double-sided board having a thickness of 0.6 mm. On the circuit board 1, the 484 electrodes 2 to be joined to the electrodes 6 of the component 5 were arranged at intervals of 200 μm in the area layout. The electrode 2 was formed by plating Cu, which was 100 μm in diameter and 18 μm in height, with Ni/Au.

Further, around the electrodes 2, the dummy electrodes 15 for absorbing excessive solder were arranged at intervals of 200 μm with the same size as the electrodes 2.

As shown in FIG. 1B, the circuit board 1 and the component 5 were joined to each other by supplying the bonding resin 4 onto the electrodes 2 and the dummy electrodes 15 of the circuit board 1 under the following conditions:

The bonding resin 4 was made of a material with a composition ratio of 50 wt % of the solder powder 3 having an average particle diameter of 20 μm, 22 wt % of epoxy resin, 22 wt % of a hardener, 5 wt. % of an activator, and 1 wt % of an accelerator. The composition of the solder powder 3 was SnBi solder.

The component 5 was a semiconductor chip that was a square of side 5.02 mm with a thickness of 150 μm. On the active surface of the component 5, Au plated electrodes that were 12 μm in height and 100 μm in diameter were arranged in the area layout so as to face the electrodes 2 of the circuit board 1.

Figure 17:
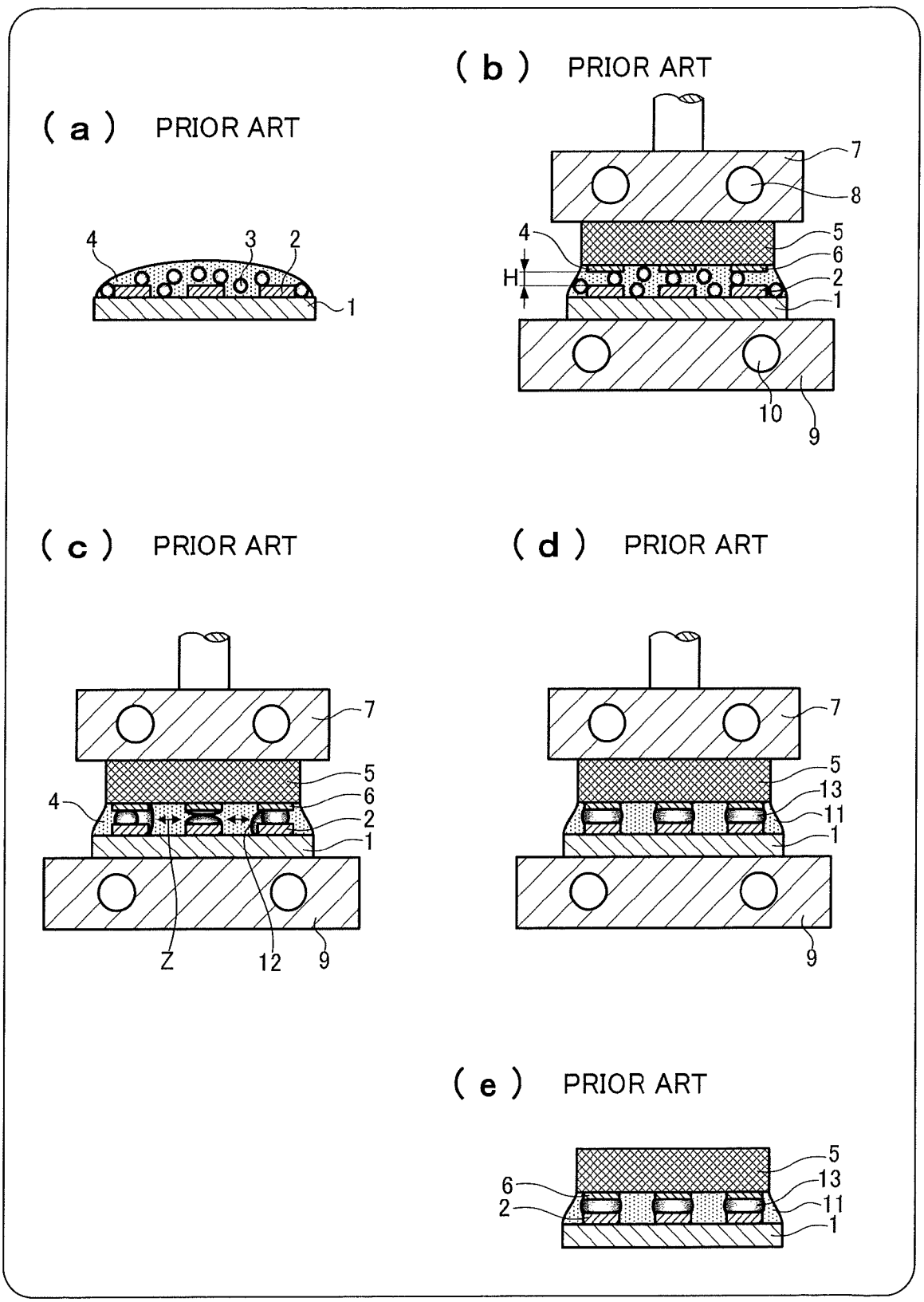
FIG. 17 is an explanatory drawing showing a joining process according to "solder self-assembly method"

After 2.0 mg of the bonding resin 4 was supplied onto the circuit board 1 by a dispensing method, the gap H between the electrodes 2 of the circuit board 1 and the electrodes 6 of the component 5 was set at 20 μm as in the prior art shown in FIG. 17B. After that, the junction temperature was set at 200° C. by the suction tool 7 and the stage 9, and then the circuit board 1 and the component 5 were joined to each other.

Evaluations of 100 joints proved that the rate of occurrence of a solder short circuit was 0% in the junction area of the electrodes 2 and the electrodes 6, whereas on the outermost dummy electrodes 15, the rate of occurrence of a solder short circuit was 54%.

According to these results, it was evident that the effect of the dummy electrodes 15 can prevent solder short circuits on the electrodes 2 for joining.

COMPARATIVE EXAMPLE 1

Figure 18A:
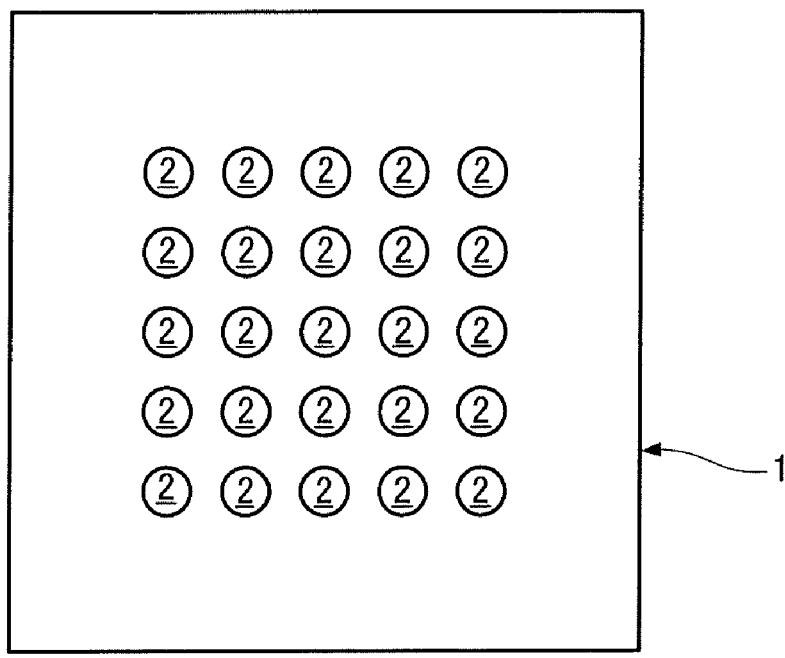
FIG. 18A is an enlarged plan view showing a circuit board of the prior art.
Figure 18B:
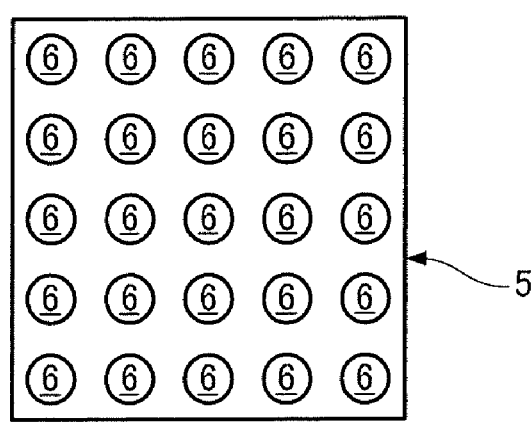
FIG. 18B is an enlarged plan view showing a component.
Figure 19A:
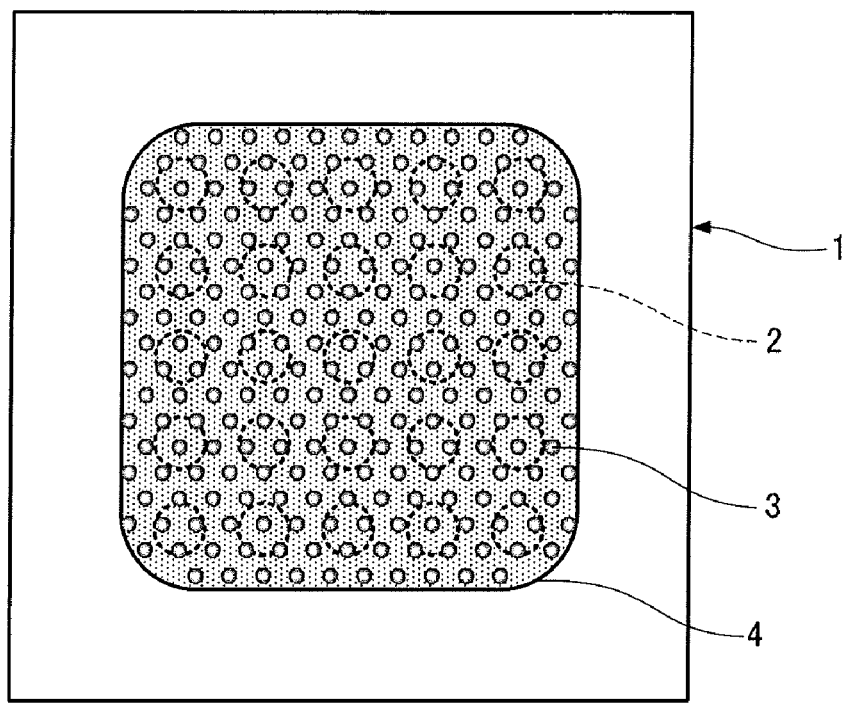
FIG. 19A is a plan view showing a state in which bonding resin is supplied to the circuit board of the prior art.
Figure 19B:
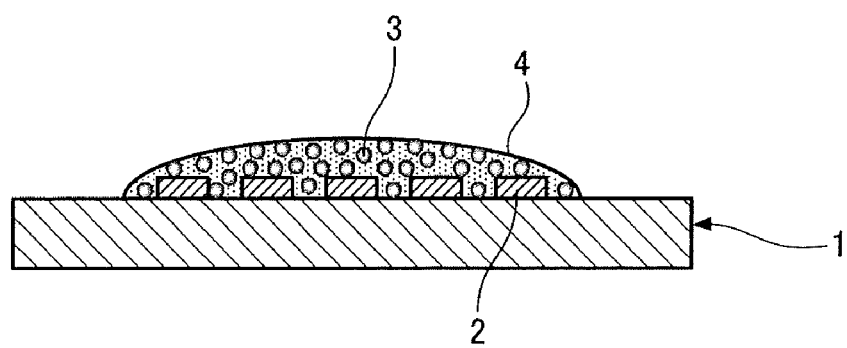
FIG. 19B is a sectional view showing the state in which the bonding resin is supplied to the circuit board of the prior art.
Figure 20A:
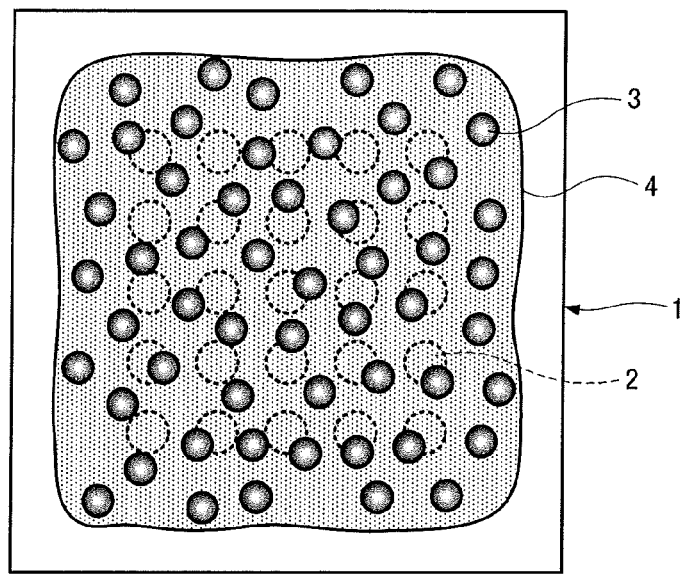
FIG. 20A is an explanatory drawing showing "solder self-assembly method" and a mechanism for the circuit board of the prior art.
Figure 20B:
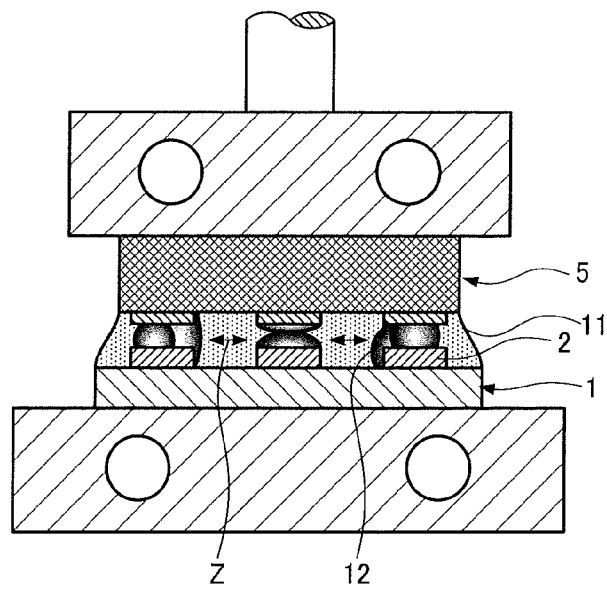
FIG. 20B is an explanatory drawing showing "solder self-assembly method" and the mechanism for the circuit board of the prior art.
Figure 20C:
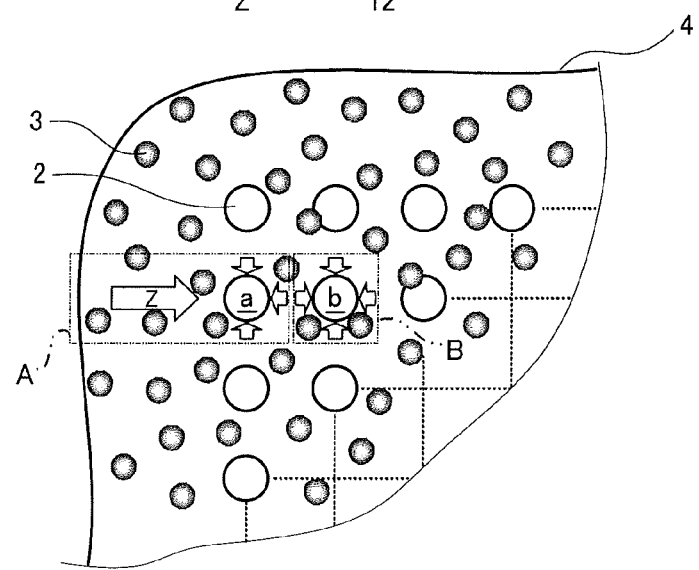
FIG. 20C is an explanatory drawing showing "solder self-assembly method" and the mechanism for the circuit board of the prior art.

As a comparative experiment, joints were evaluated also on the circuit board 1 of the prior art shown in FIG. 18A, in which the dummy electrodes 15 for absorbing excessive solder are not provided.

On the circuit board 1, the 484 electrodes 2 were similarly arranged at intervals of 200 μm in the area layout. The electrodes 2 were 100 μm in diameter and 18 μm in height and were formed by plating Cu with Ni/Au. The component 5 was a semiconductor chip on which Au plated electrodes that were 12 μm in height and 100 μm in diameter were arranged in the area layout so as to face the electrodes 2 of the circuit board 1.

Figure 21A:
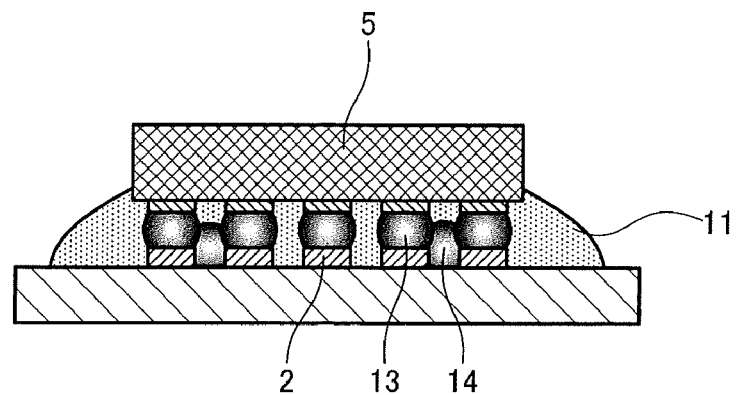
FIG. 21A is a sectional view showing a joining result of the prior art.
Figure 21B:
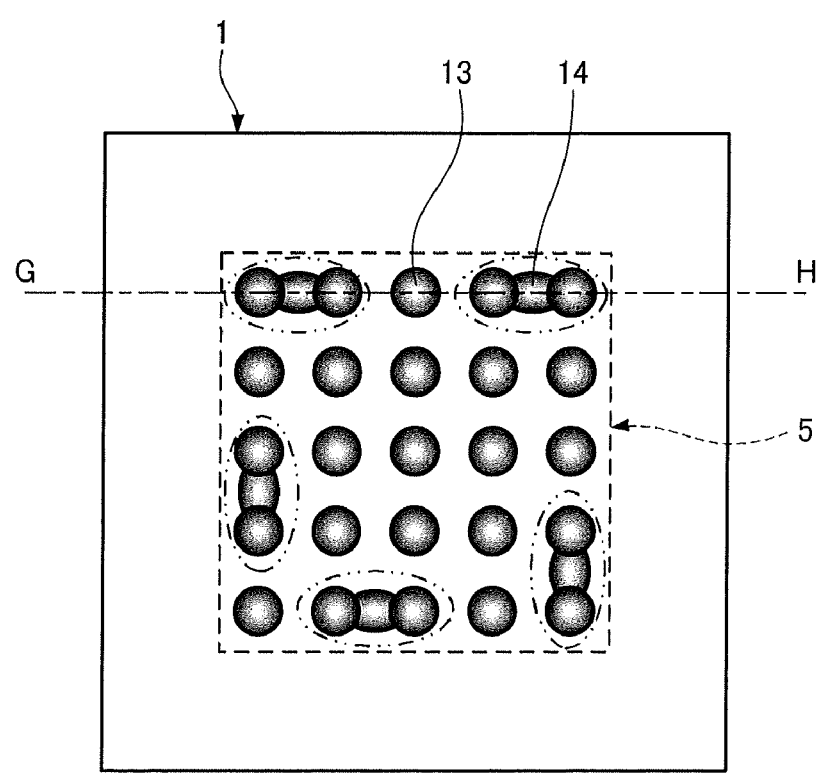
FIG. 21B is a plan view showing the joining result of the prior art.

Evaluations of 100 joints proved that the rate of occurrence of the solder short circuit 14 was 75% only on the outermost electrodes 2 in FIG. 21B.

According to these results, it was evident that the dummy electrodes 15 provided outside the electrodes 2 can remarkably suppress solder short circuits on the junction electrodes.

Figure 4:
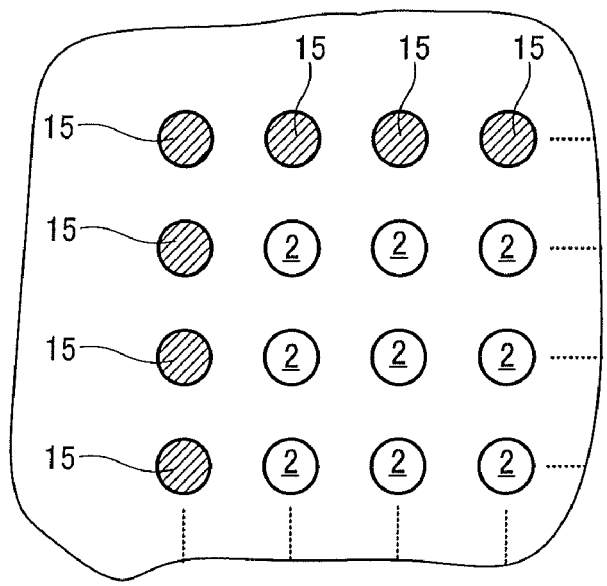
FIG. 4 is an enlarged plan view showing the specific shapes of the dummy electrodes according to the first embodiment.
Figure 5:
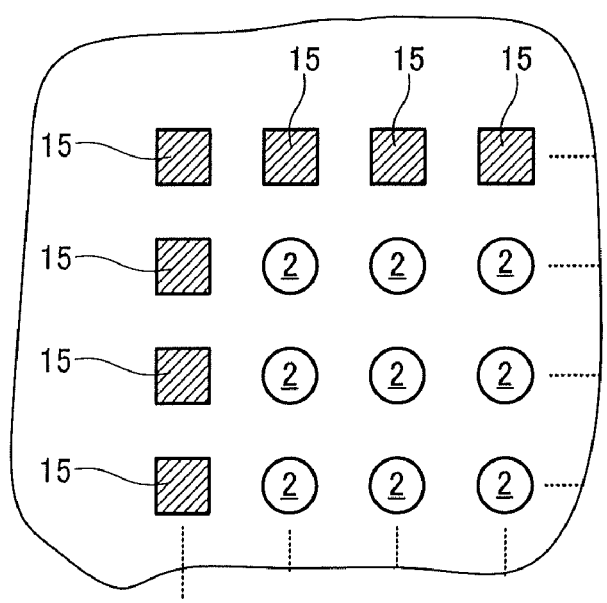
FIG. 5 is an enlarged plan view showing another specific shapes of the dummy electrodes according to the first embodiment.

As shown in FIG. 4, the dummy electrodes 15 have the same shape and size as the electrodes 2. The present invention is not limited to this configuration. To be specific, the dummy electrodes 15 may be different in shape and size from the electrodes 2. For example, the dummy electrodes 15 may be squares as shown in FIG. 5.

Moreover, the dummy electrodes 15 are formed at equal intervals in a row around the electrodes 2 in the area layout.

Figure 6A:
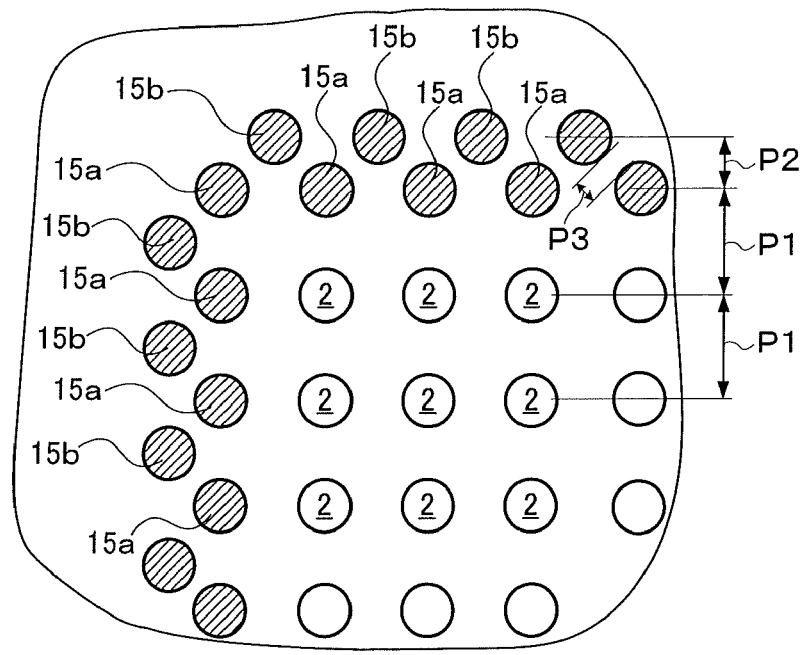
FIG. 6A is an enlarged plan view showing still another specific shapes of the dummy electrodes before soldering according to the first embodiment.
Figure 6B:
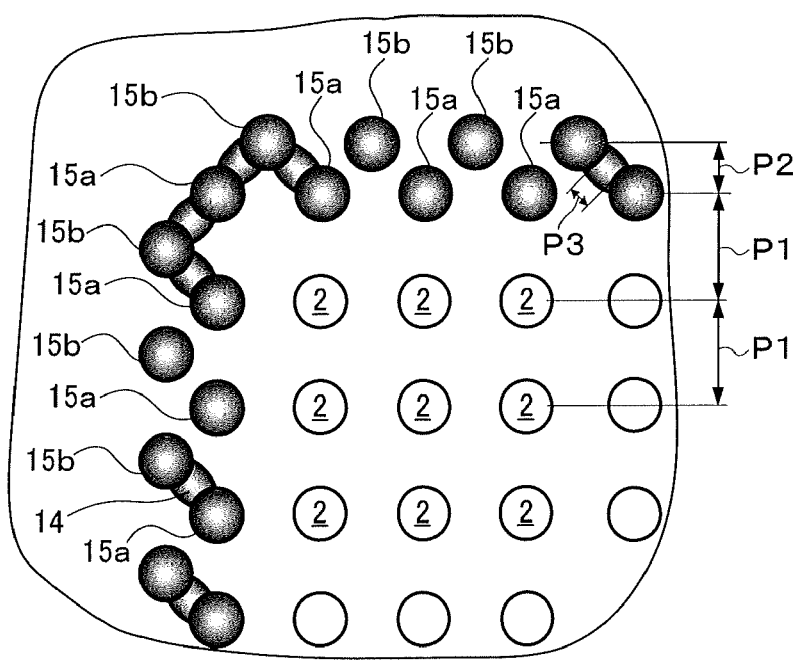
FIG. 6B is an enlarged plan view showing the still another specific shapes of the dummy electrodes after soldering according to the first embodiment.

The present invention is not limited to this configuration. To be specific, as shown in FIG. 6A, the dummy electrodes 15 may be formed in multiple rows. More specifically, around the electrodes 2 in the area layout, dummy electrodes 15a are arranged at intervals P1 like the electrodes 2. Further, dummy electrodes 15b are arranged at intervals P2, which are shorter than the intervals P1, around the dummy electrodes 15a in the single row such that the dummy electrodes 15b are each centered between the dummy electrodes 15a in a staggered arrangement. Thus the adjacent dummy electrodes 15a and 15b are spaced at intervals P3, which are shorter than the intervals P1 of the electrodes 2. When the circuit board 1 of FIG. 6A is soldered under the foregoing conditions, the solder short circuits 14 occur between the adjacent dummy electrodes 15a and 15b as shown in FIG. 6B, so that excessive solder is absorbed and the occurrence of solder short circuits is suppressed on the electrodes 2 in the area layout.

In FIGS. 4 to 6A, it is preferable to arrange similar numbers of the dummy electrodes 15 at equal intervals around the outermost electrodes of the electrodes 2 in the area layout. The present invention is not limited to this configuration. Any number of dummy electrodes may be formed at any positions to obtain the same effect.

In FIGS. 4 to 6A, the electrodes 2 for joining and the dummy electrodes 15 are not electrically connected to each other. The present invention is not limited to this configuration.

Figure 7A:
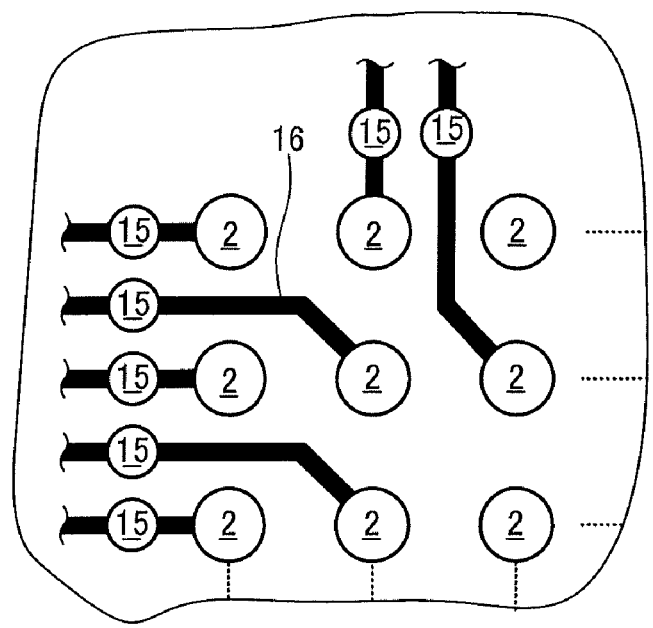
FIG. 7A is an enlarged plan view showing still another specific shapes of the dummy electrodes before soldering according to the first embodiment.
Figure 7B:
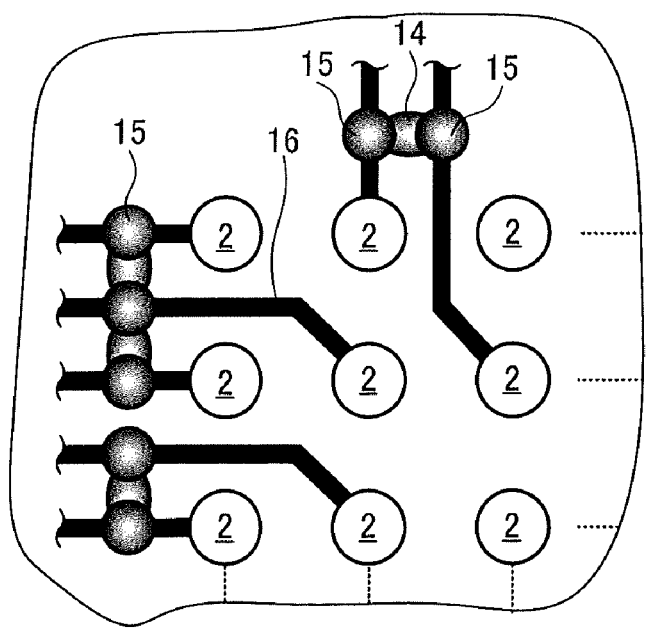
FIG. 7B is an enlarged plan view showing the still another specific shapes of the dummy electrodes after soldering according to the first embodiment.

For example, as shown in FIG. 7A, the dummy electrodes 15 may be formed on a circuit pattern 16 routed through the board 1 from the electrodes 2 in the area layout. In this case, as shown in FIG. 7B, the solder short circuits 14 occurring between the dummy electrodes 15 absorb excessive solder, thereby suppressing solder short circuits on the electrodes 2 in the area layout. Moreover, in this case, the shapes of the dummy electrodes 15 are not limited and thus the dummy electrodes 15 may have any shapes. Instead of the single line arrangement of FIG. 7A, the dummy electrodes 15 may have a staggered arrangement or may be alternately removed. Even when the dummy electrodes 15 are close to each other, solder attracted to the dummy electrodes 15 flows also into the circuit pattern 16 and wets the circuit pattern 16. Thus, a solder bridge hardly occurs and causes short circuits between the adjacent dummy electrodes 15. Specifically, in this case, a solder resist is not provided outside the junction area of the routed circuit pattern 16.

In the first embodiment, the dummy electrodes 15 are provided on the circuit board 1. The dummy electrodes 15, 15a, and 15b may be provided on the component 5 to obtain the same effect.

(Second Embodiment)

Referring to FIGS. 11 to 16, a second embodiment of the present invention will be described below.

FIGS. 8A and 8B to 10 show the prior art in which electrodes 2 are arranged on the periphery of a circuit board 1.

First, the prior art will be described below for comparison.

Figure 8A:
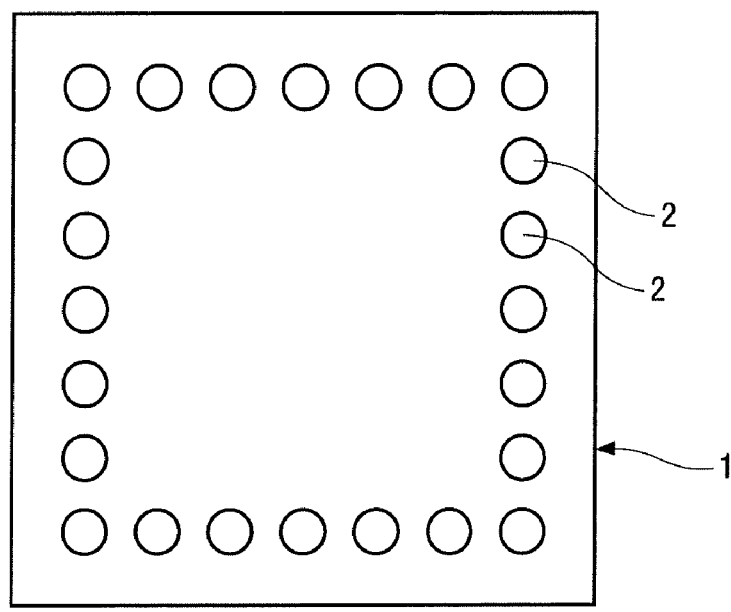
FIG. 8A is an enlarged plan view of a circuit board of the prior art.

The circuit board 1 of FIG. 8A was a glass epoxy board of grade FR4 and also a double-sided board having a thickness of 0.6 mm. On the circuit board 1, the 240 electrodes 2 to be joined to an electronic component were peripherally arranged at intervals of 150 μm. The substrate electrodes 2 were formed by plating Cu, which was 60 μm in width and 15 μm in height, with Ni/Au.

Figure 8B:
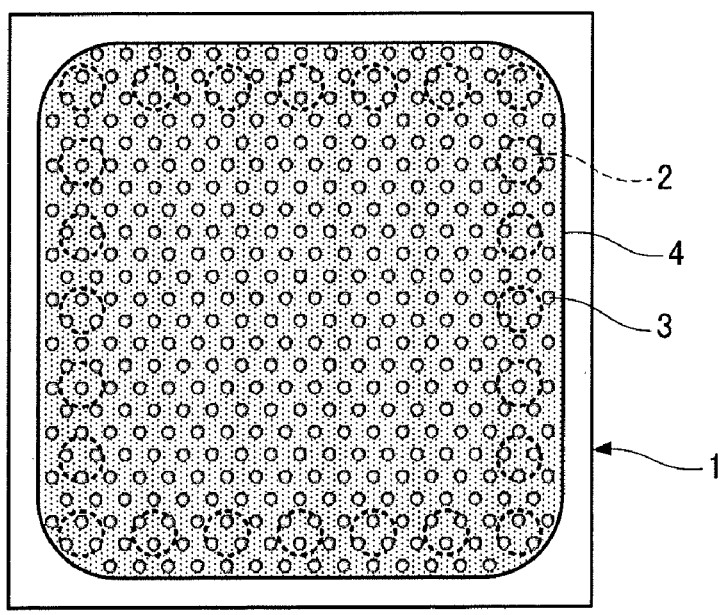
FIG. 8B is a plan view showing a state in which bonding resin is supplied to the circuit board of the prior art.

As shown in FIG. 8B, the circuit board 1 and a component 5 were joined to each other by supplying bonding resin 4 onto the electrodes 2 on the circuit board 1 under the following conditions:

The bonding resin 4 was made of a material with a composition ratio of 50 wt % of solder powder 3 having an average particle diameter of 20 μm, 22 wt % of epoxy resin, 22 wt % of a hardener, 5 wt % of an activator, and 1 wt % of an accelerator. The composition of the solder powder 3 was SnBi solder.

After 1.0 mg of the bonding resin 4 was supplied onto the circuit board 1 by a dispensing method, a gap H between the electrodes 2 of the circuit board 1 and electrodes 6 of the component 5 was set at 20 μm as in the prior art shown in FIG. 17B. After that, the junction temperature was set at 200° C. by a suction tool 7 and a stage 9, and then the circuit board 1 and the component 5 were joined to each other.

The component 5 was a semiconductor element having a thickness of 400 μm. On the active surface of the component 5, Au plated electrodes that were 12 μm in height and 60 μm in diameter were peripherally arranged so as to face the electrodes 2 of the circuit board 1.

Figure 9:
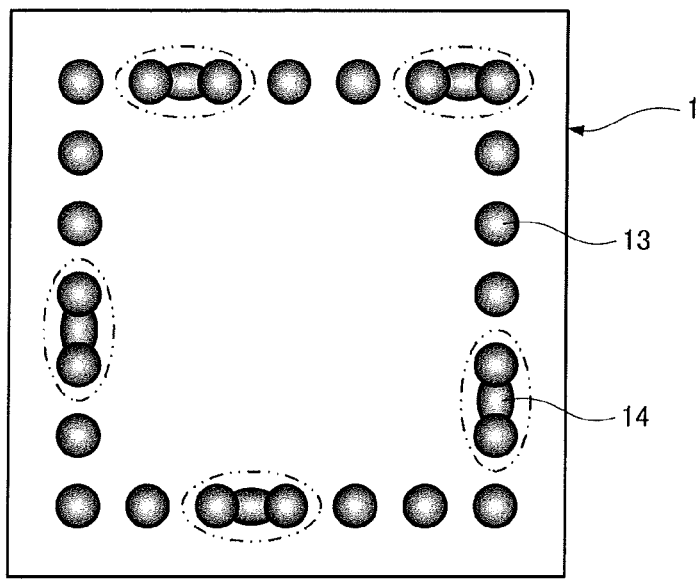
FIG. 9 is a plan view showing the occurrence of short circuits according to the prior art.

Evaluations of 100 joints proved that the rate of occurrence of a solder short circuit 14 in FIG. 9 was 64% on the electrodes 2. FIG. 9 is a schematic drawing showing the solder joints of the electronic component and the circuit board, the solder joints being observed by X-rays.

Figure 10:
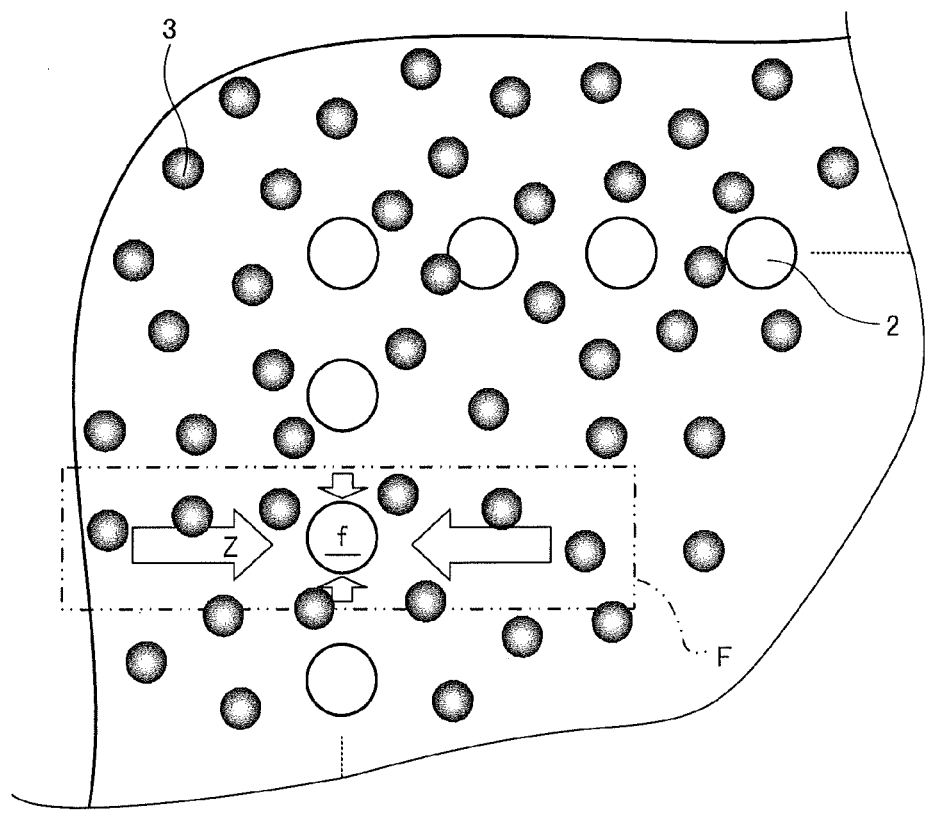
FIG. 10 is an explanatory drawing showing the mechanism of the occurrence of a short circuit according to the prior art.

In this example of joining, in a process of joining the electrodes 2 peripherally arranged on the circuit board 1 as shown in FIG. 10, the solder powder 3 in an area F is likely to self-assemble for, for example, an electrode f. The area F is obtained by uniformly dividing distances from the adjacent electrodes with the electrode f placed at the center of the area F, and the area F widely includes the inner and outer sides of the electrode f peripherally arranged on the circuit board 1. Since a flow path Z does not have any other electrodes on which solder wets, the solder powder 3 widely distributed inside and outside the peripherally arranged electrode f assembles with a larger solder amount than necessary for joining. It is estimated that the solder is excessively supplied for this reason and causes a solder short circuit.

Figure 11:
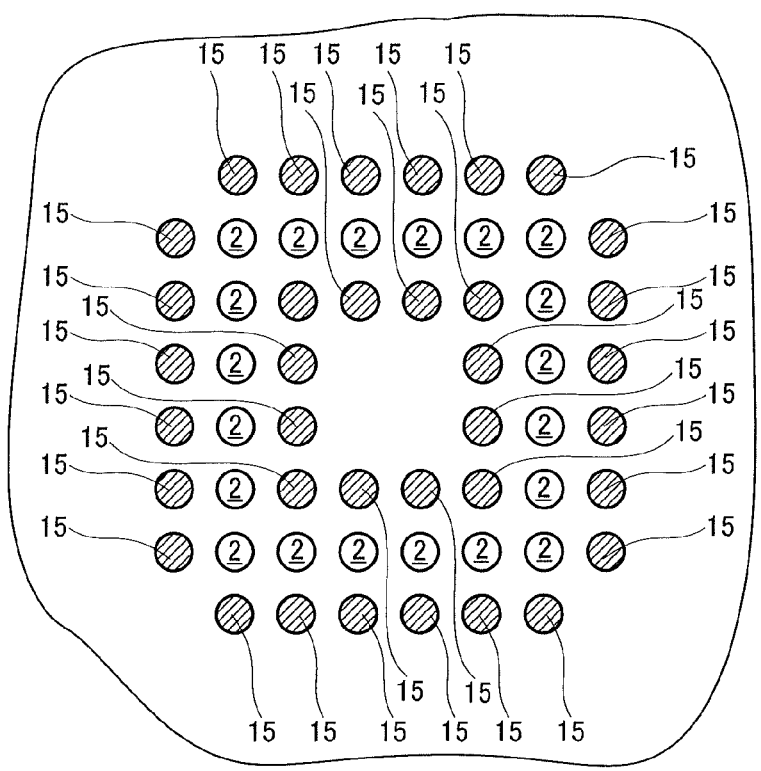
FIG. 11 is an enlarged plan view showing a circuit board used in a second embodiment of the present invention.

In the second embodiment of the present invention, as shown in FIG. 11, joints were evaluated using a substrate on which dummy electrodes 15 for absorbing excessive solder were uniformly spaced inside and outside electrodes 2 peripherally arranged on a circuit board 1. The dummy electrodes 15 had the same size as the electrodes 2 and were made of the same material as the electrodes 2.

As a result of evaluations of 100 joints under completely the same process conditions as the joints of the substrate electrode configuration shown in FIG. 8A, the rate of occurrence of a solder short circuit was 0%.

This result proved that also in the electrode configuration of a peripheral arrangement, the dummy electrodes 15 for absorbing excessive solder inside and outside the electrodes 2 considerably suppress solder short circuits on junction electrodes.

Figure 12:
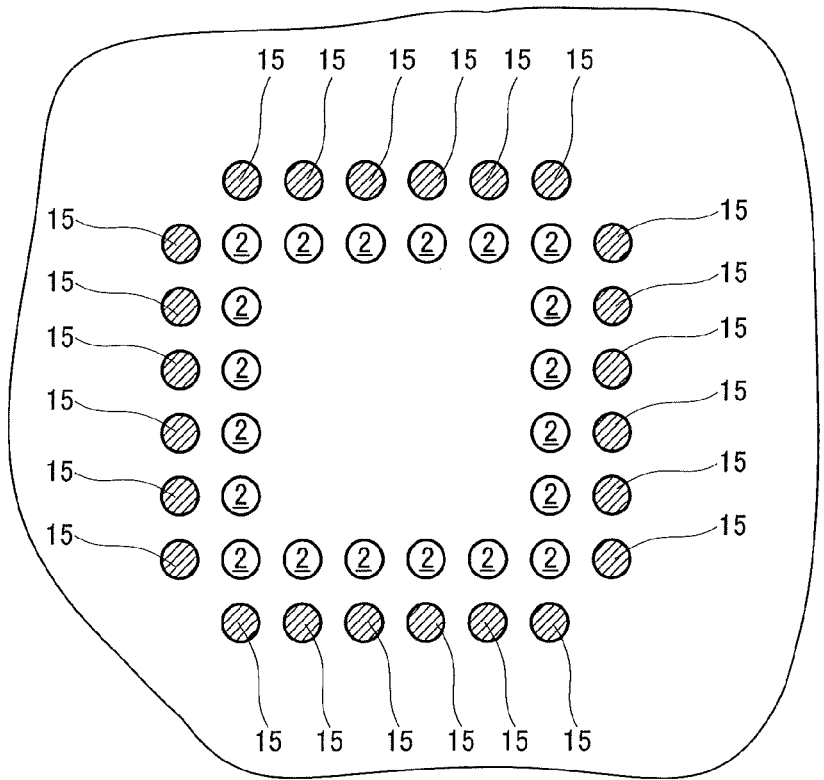
FIG. 12 is an enlarged plan view showing the circuit board according to another specific example of the second embodiment.
Figure 13:
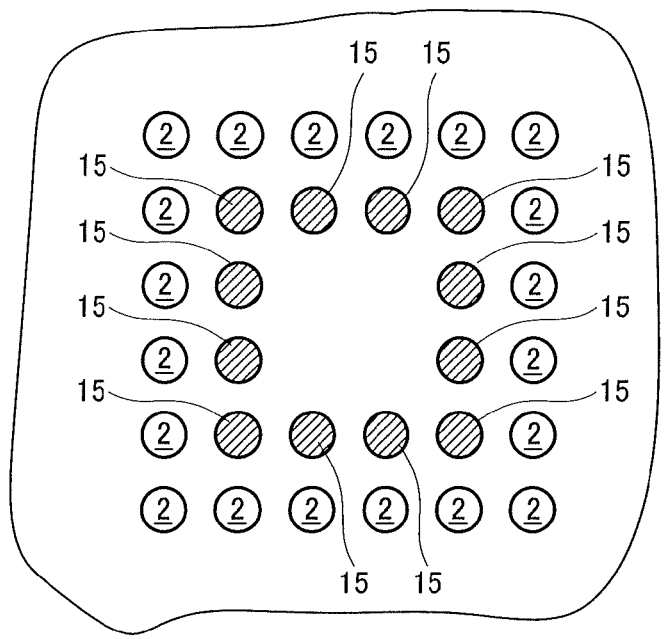
FIG. 13 is an enlarged plan view showing the circuit board according to still another specific example of the second embodiment.

As shown in FIG. 11, the dummy electrodes 15 of the same size and shape are formed inside and outside the peripherally arranged electrodes 2. The present invention is not limited to this configuration. The dummy electrodes 15 may be provided only on one side of the peripherally arranged electrodes as shown in FIGS. 12 and 13 or the dummy electrodes 15 may be formed inside and outside the electrodes in a mixed manner according to the size of an object to be joined, a bonding pitch, and a circuit pattern design. Further, the shapes and the number of dummy electrodes 15 may be optionally determined according to an object.

Figure 14:
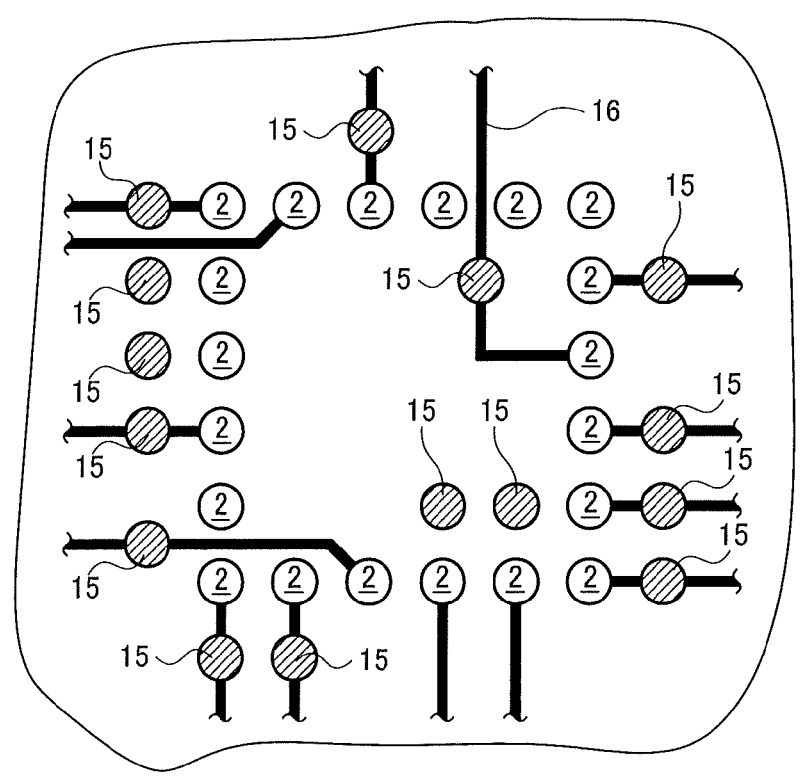
FIG. 14 is an enlarged plan view showing the circuit board according to still another specific example of the second embodiment.

As shown in FIG. 14, the dummy electrodes 15 may be formed on a circuit pattern 16 of the peripherally formed electrodes 2. The circuit pattern 16 is routed through the surface layer of the substrate. The shapes of the dummy electrodes 15 on the circuit pattern 16 are not particularly limited and thus the dummy electrodes 15 may have any shapes at any positions. Even when the dummy electrodes 15 are close to each other, solder attracted to the dummy electrodes 15 flows also into the circuit pattern 16 and wets the circuit pattern 16. Thus, a solder bridge hardly occurs and causes a short circuit between the adjacent dummy electrodes 15. Specifically, in this case, a solder resist is not provided outside the junction area of the routed circuit pattern 16.

Figure 15:
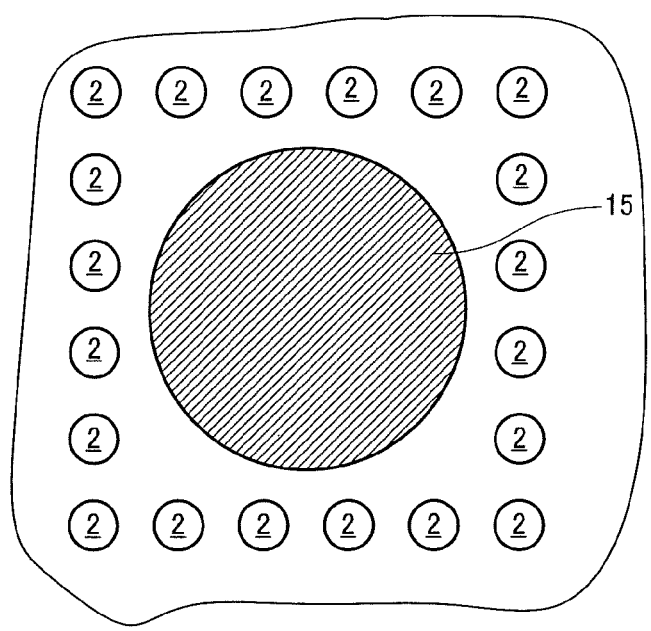
FIG. 15 is an enlarged plan view showing the circuit board according to still another specific example of the second embodiment.
Figure 16:
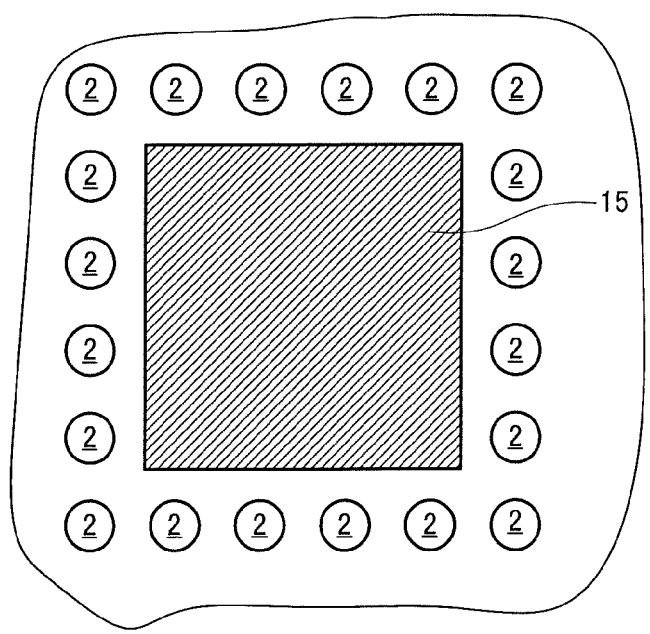
FIG. 16 is an enlarged plan view showing the circuit board according to still another specific example of the second embodiment.

Further, as shown in FIGS. 15 and 16, at least one large dummy electrode 15 for absorbing excessive solder may be formed inside the peripherally arranged junction electrodes 2.

Also in the second embodiment, the dummy electrodes 15 for absorbing excessive solder may be provided on the component 5 instead of the circuit board 1 to obtain the same effect.

In the foregoing embodiments, the conductive particles contained in the bonding resin 4 are the solder powder 3. Moreover, solder coating copper powder, solder coating silver powder, and conductive particles such as metal particles coated with a low-melting metal are similarly usable as the conductive particles.

The present invention can contribute to improvement in quality of connection between the electrodes of a semiconductor chip, which is used for electronic equipment having been reduced in size and weight and has a small and fine electrode pitch, and the electrodes of a printed circuit board on which a fine wiring pattern is formed.

What is claimed is:

1. A method of joining an electronic component, when bonding resin containing conductive particles is disposed between a substrate and the component, the bonding resin retained in a gap between first electrodes of the substrate and second electrodes of the component is heated and flows to cause the conductive particles melted between the first electrodes and the second electrodes to self-assemble, and then the substrate and the component are cooled to a temperature not higher than a solidification temperature of the conductive particles to mount the component on the substrate, the method comprising:

arranging first dummy electrodes adjacent to the first electrodes and second dummy electrodes adjacent to the first dummy electrodes at shorter intervals than the first electrodes on the substrate, outside a junction region containing all of the first electrodes and the second electrodes and in the bonding resin, the first and second dummy electrodes being arranged as dummy electrodes not being involved in electrical connection between the substrate and the component; and causing the conductive particles melted between the first electrodes and the second electrodes and on the dummy electrodes to self-assemble by a flow of the heated bonding resin and solidify.

* * * * *